United States Patent
Hara et al.

(10) Patent No.: US 7,476,553 B2
(45) Date of Patent: Jan. 13, 2009

(54) TRANSFER BASE SUBSTRATE AND METHOD OF SEMICONDUCTOR DEVICE

(75) Inventors: Hiroyuki Hara, Nagano-ken (JP); Tatsuya Shimoda, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 475 days.

(21) Appl. No.: 11/220,600

(22) Filed: Sep. 8, 2005

(65) Prior Publication Data
US 2006/0079010 A1    Apr. 13, 2006

(30) Foreign Application Priority Data
Sep. 30, 2004    (JP)    ............... 2004-288080

(51) Int. Cl.
*H01L 31/26* (2006.01)
(52) U.S. Cl. .................. 438/14; 438/15; 438/106; 257/E21.35; 257/E21.411; 257/E21.499; 257/E29.202
(58) Field of Classification Search .......... 438/14, 438/15, 18, 106, 107, 149, 238, 381
See application file for complete search history.

(56) References Cited

U.S. PATENT DOCUMENTS

| | | | |
|---|---|---|---|
| 6,541,869 B1 * | 4/2003 | Gudesen et al. | ............. 257/777 |
| 6,887,650 B2 | 5/2005 | Shimoda et al. | |
| 7,090,139 B2 * | 8/2006 | Kasuga et al. | ............... 235/494 |
| 2004/0114061 A1 | 6/2004 | Kimura et al. | |

FOREIGN PATENT DOCUMENTS

| | | |
|---|---|---|
| JP | A-9-113562 | 5/1997 |
| JP | A-11-020360 | 1/1999 |
| JP | A-11-168214 | 6/1999 |
| JP | 2003-318372 | 7/2003 |
| JP | 2004-228373 | 12/2004 |

* cited by examiner

*Primary Examiner*—David Nhu
(74) *Attorney, Agent, or Firm*—Oliff & Berridge, PLC

(57) ABSTRACT

A transfer base substrate comprises: a substrate; a plurality of transfer thin film circuits formed on the substrate via removing layer; a test circuit formed on the substrate for checking circuit operation; and a wiring coupling each of transfer thin film circuits with a test circuit.

10 Claims, 8 Drawing Sheets

TRANSFER BASE SUBSTRATE AND METHOD OF SEMICONDUCTOR DEVICE

RELATED APPLICATION INFORMATION

This application claims priority to Japanese Application No. 2004-288080, filed Sep. 30, 2004. The contents of the Japanese Application are expressly incorporated herein by reference.

BACKGROUND OF THE INVENTION

1. Technical Field

The present invention is related to a semiconductor device and a method of testing a semiconductor device. More specifically, it is related to a transfer base substrate used for manufacturing a semiconductor device with remove and transfer technology of a thin film circuits and a method of testing a transfer base substrate.

2. Related Art

It has been proposed that many of thin film elements or thin film circuits (transfer thin film circuits) having a given function, which is an object of transfer, are formed on a transfer base substrate by a semiconductor process and a part of formed transfer thin film circuits is transferred to a final substrate (a substrate, which receives transfer), manufacturing a semiconductor device. For example, the Japanese Unexamined Published Patent 2003-318372 shows an instrument for manufacturing an electronic device by transferring a part of thin film semiconductor circuits group formed on a transfer base substrate into a substrate, which receives the transfer. Further, the Japanese Unexamined Published Patent 2004-228373 shows a technology of transferring a part of part of thin film semiconductor circuits group formed on a transfer base substrate into a substrate, which receives the transfer. Using this technology of removing and transferring a thin film semiconductor can provide a semiconductor device formed on a plastic substrate with low temperature heat resistance. Further, it is possible to manufacture a large size semiconductor device by gluing many of transfer thin film circuits together like tiles.

However, many of transfer thin film circuits formed on a transfer base substrate are formed every region, which is an unit of transfer and separated from other region as shown in FIG. 10. There is no wiring for operating transfer thin film circuits on a transfer base substrate. Transfer thin film circuits are transferred from the transfer base substrate into a final substrate in which circuit wirings are formed, thus making the operation of transfer thin film circuits possible, as a circuit activated. Namely, it is impossible to confirm the operation of transfer thin film circuits before transferring, even if some of malfunctioned transfer thin film circuits due to defects on manufacturing process on a transfer base substrate are existed. Checking the operation of a circuit after transferring given transfer thin film circuits into a final substrate can not improve production yield, unfavorably increasing a manufacturing cost.

Under such situation, it is considered that the operation of transfer thin film circuits is confirmed by contacting a probe with them. But, the circuits receive some damages by the probe. Further, it takes longer time to check each of these transfer thin film circuits by contacting a prove with it.

SUMMARY

The advantage of the present invention is to provide a method of manufacturing a thin film semiconductor device, which can check defects of plurality of transfer thin film circuits formed on a transfer base substrate before transferring.

According to the first aspect of the invention, the transfer base substrate comprises; a substrate; a plurality of transfer thin film circuits formed on the substrate via removing layer, a test circuit formed on the substrate for checking circuit operation; and a wiring coupling each of transfer thin film circuits with a test circuit.

This structure can immediately check (test) defective or non-defective transfer thin film circuits which is an object of transfer before transferring since the transfer thin film circuits can be electrically coupled with a test circuit on a transfer base substrate. Further, it is possible to collect test data via computer system. Selecting non-defective transfer thin film circuits and using them can improve production yield of semiconductor devices as final products.

A plurality of transfer thin film circuits may be arranged in a matrix on the substrate. The test circuit may be arranged surrounding a region for forming the plurality of transfer thin film circuits. The wiring may be arranged so as to couple with a plurality of transfer thin film circuits arranged in a matrix or a grid through spaces among the plurality of transfer thin film circuits, arranged in a matrix. These structures prevent t a test circuit and a wiring from interrupting removing and transferring.

A plurality of the transfer thin film circuits may be arranged in a matrix on the substrate. The test circuit may be arranged along outer circumference of a region for forming the plurality of transfer thin film circuits. The wiring may be arranged so as to couple with at least any of a row and column directions of a plurality of transfer thin film circuits arranged in a matrix. Hence, this structure prevents areas assigned to transfer thin film circuits from substantially decreasing due to wirings for test.

The test circuit may check the operation of each of transfer thin film circuits by individually operating each of transfer thin film circuits arranged in a matrix.

Each of transfer thin film circuits may include at least any of a diode, a transistor, a resistance, a capacitor, an inductor and a wire. Further, they may include an integrated circuit in which the above elements are combined.

The transfer thin film circuits may be a drive circuit for electro optical device as a semiconductor device, a drive circuit for an organic electro luminescent display or a liquid crystal display.

Further, the transfer base substrate comprises a substrate, a plurality of transfer thin film circuits, which are capable of removed and transferred and a wiring coupling each of transfer thin film circuits with a terminal of an outside test circuit Even having such structure, each of transfer thin film circuits can be checked by the test circuit outside of the substrate.

Further, according to the other aspect of the invention, a method of manufacturing a semiconductor device comprises: forming a plurality of transfer thin film circuits which is capable of removed and transferred and a test circuit for checking the operation of each of the transfer thin film circuits on a transfer base substrate; obtaining test data of each of the transfer thin film circuits in the transfer base substrate by checking the operation of each of the transfer thin film circuits via the test circuit; selecting any of the transfer thin film circuits that passed the check based on the test data from the transfer base substrate; and transferring the passed thin film circuits into a substrate, which receives the transfer. This method transfers only non-defect transfer thin film circuits into a substrate to receive their transfer and improves production yield of final semiconductor devices.

According to these aspects of the invention, defect or non-defect of transfer thin films can be easily judged at the stage of the transfer base substrate, and a semiconductor device is fabricated without using defect transfer thin films.

BRIEF DESCRIPTION OF THE DRAWINGS

The invention will be described with reference to the accompanying drawings, wherein like numbers refer to like elements, and wherein:

FIG. 3A is a circuit diagram for driving a EL elements for organic electro luminescent (EL) display and FIG. 3B is a circuit diagram for driving liquid crystal elements for a liquid crystal display;

DESCRIPTION OF THE EMBODIMENTS

Figure 1:
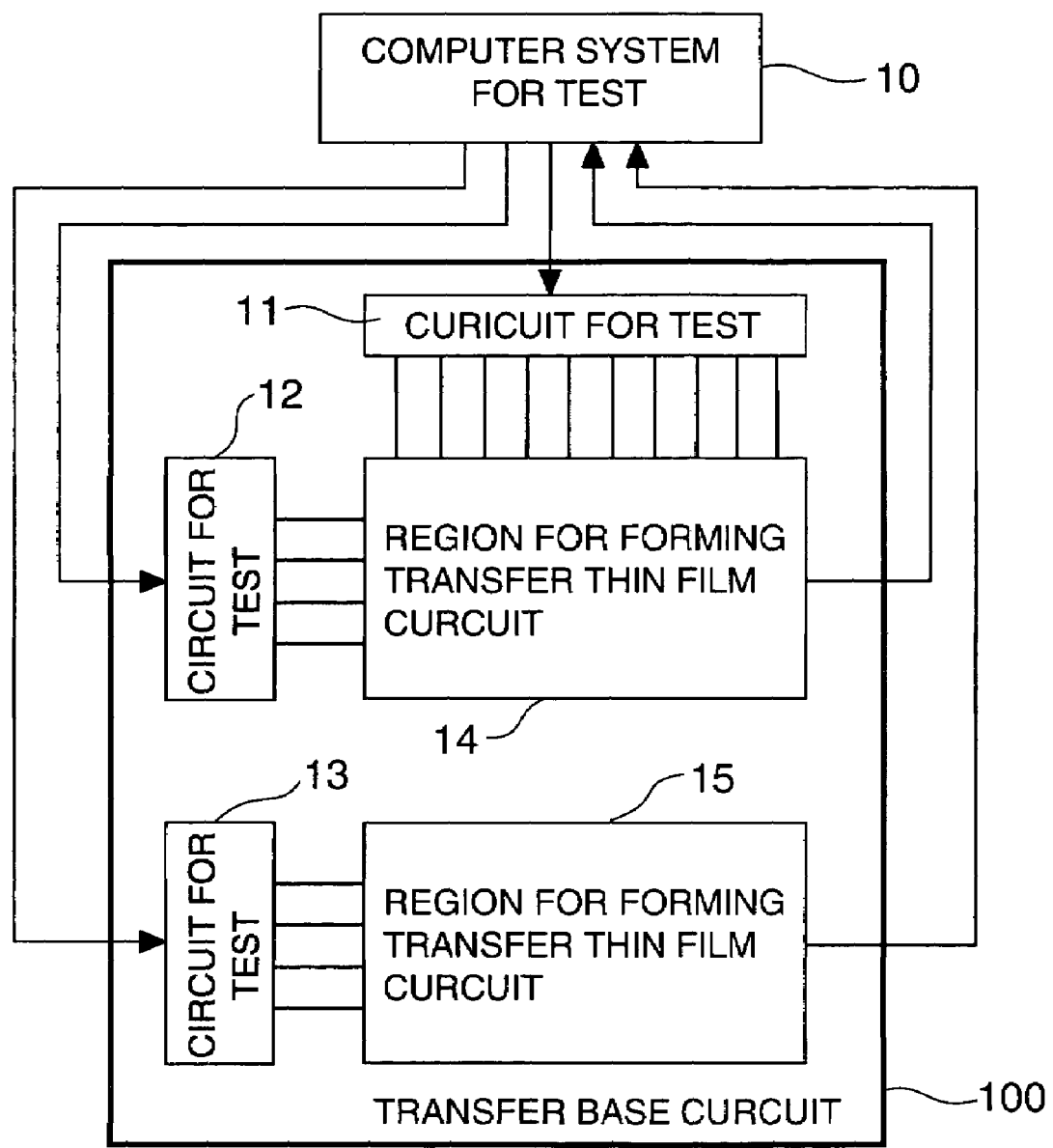
FIG. 1 is a block diagram showing an overall structure of the present invention.

FIG. 1 shows a transfer base substrate of the present invention. A transfer base substrate 100 includes a test circuit 13 and a wiring for testing a group of transfer thin film circuits, which is an object of transfer, in order to check defect or no-defect of transfer thin film circuits before removing and transferring thin film circuits. The detail of the transfer base substrate 100 is described later.

In the center of the transfer base substrate 100, regions 14 and 15 for forming thin film circuits are located. As described later, regions 14 and 15 for forming thin film circuits are arranged in a matrix and thin film circuits, which are removed and transferred, are formed in each region. Each of thin film circuits is coupled to an output line. Test circuits 11,12 and 13 are located along outer circumference of regions 14 and 15 for forming thin film circuits.

Test circuits 11, 12 and 13 receive test signals from a computer system 10 for testing located outside and drive thin film circuits designated by a computer command. The output signal regarding the operation of thin film circuits inputs to the computer system 10 for testing via circuit output lines.

The computer system 10 detects the output from thin film circuits designated by a computer command and judges whether the operation is normal or abnormal. The computer system 10 tests all thin film circuits on the substrate 100 and memorizes data of defect or non-defect result of each of thin film circuits on the substrate 100. It holds these judged results for every substrate, making only non-defect thin film transistors be transferred to a substrate, which receives the transfer during removing and transferring process.

Namely, a semiconductor device is manufactured by the following processes. Firstly, these processes are to form a plurality of transfer thin film circuits, which is capable of removed and transferred, and a test circuit for checking the operation of each of the transfer thin film circuits on a transfer base substrate; to obtain test data of each of the transfer thin film circuits in the transfer base substrate by checking the operation of each of the transfer thin film circuits via the test circuit; and to select any of the transfer thin film circuits that passed the check based on the test data from the transfer base substrate and transferring the passed thin film circuits into a substrate to receive the transfer.

First Embodiment

Firstly, a technology of removing and transferring the above thin film semiconductor circuit is explained.

Figure 2:
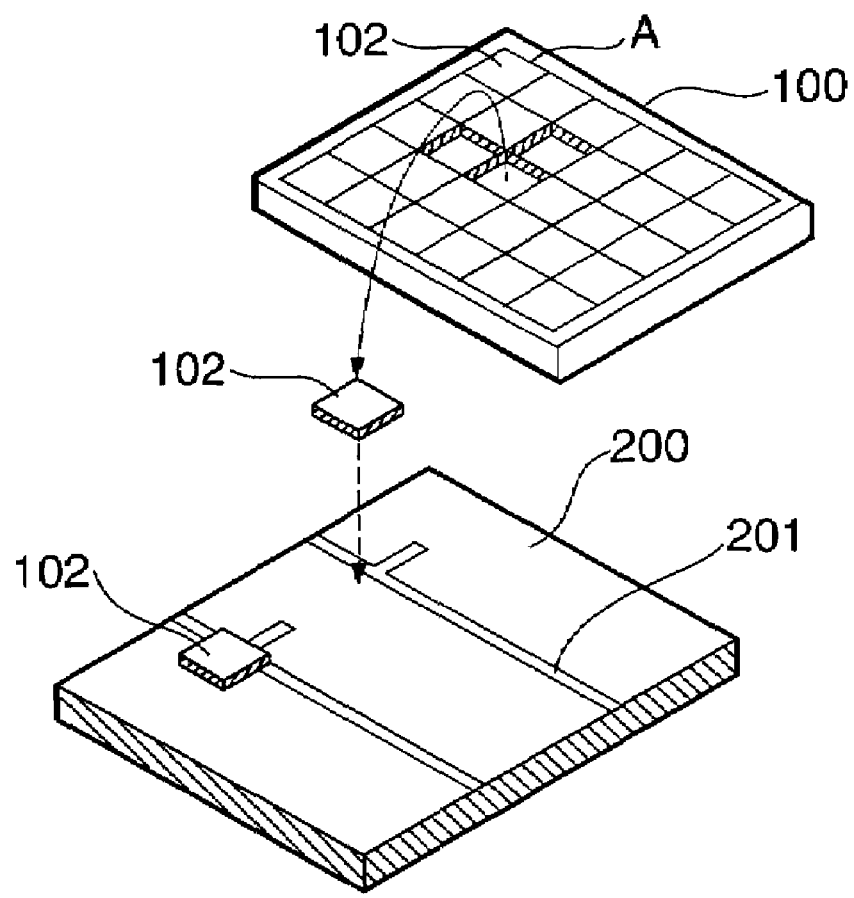
FIG. 2 shows an example of technology for removing and transferring.

FIG. 2 is a schematic view of a method of removing and transferring. In this case, the substrate 100 is a transfer base substrate. As shown in the figure, a thin film circuits 102 is formed on the substrate 100 by a semiconductor process via removing layer (not shown.) The circuit becomes an object to be transferred. The film circuit 102 is formed in a plurality of regions A, which are arranged in a matrix on the substrate. As the above removing layer, an amorphous silicon layer is used.

Next, energy beam such as laser is irradiated onto a removing layer of thin film circuits 102 and destroys a part of the removing layer. Thin film circuits 102 are removed from a given part of the substrate 100 and placed on a predetermined position on a final substrate (a substrate receiving the transfer) 200. A wiring 201 is already formed on the substrate 200 and connected to ends of thin film circuits 102.

Figure 3A:
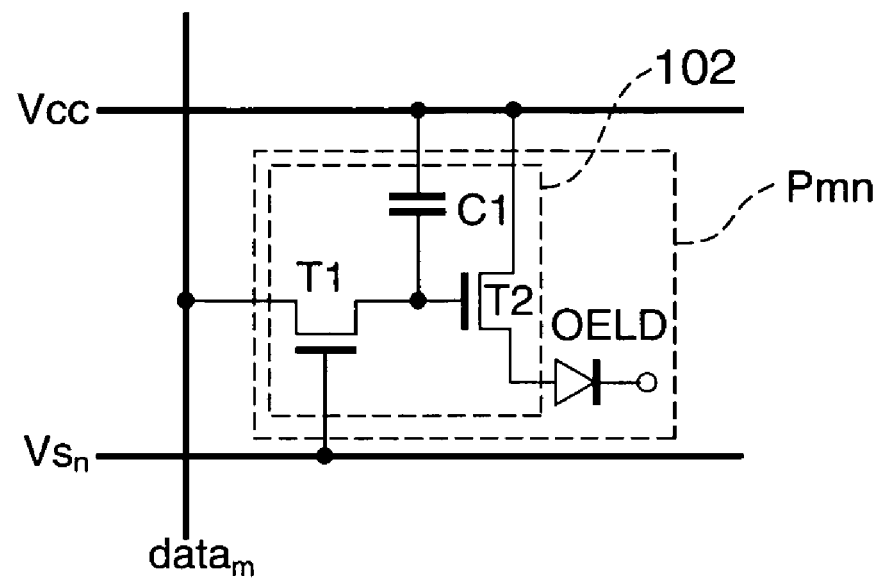
FIGS. 3A and 3B show of technology for removing and transferring.
Figure 3B:
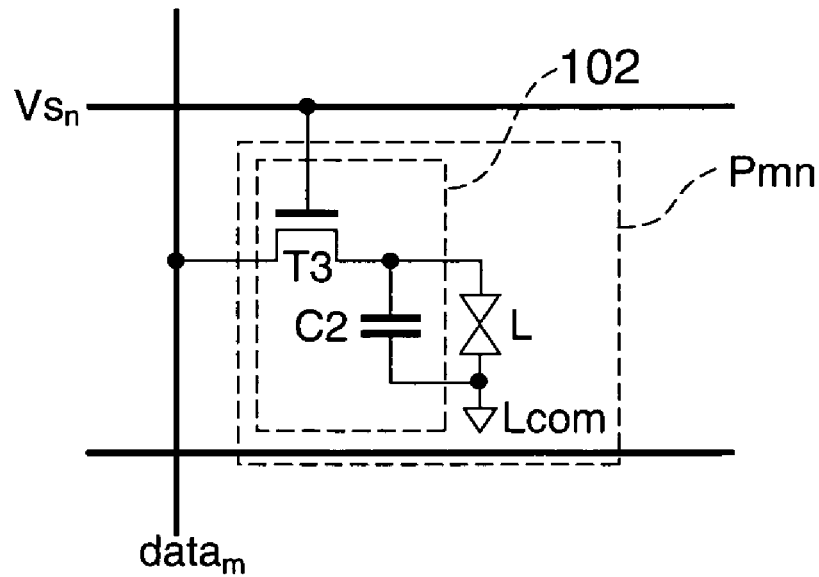

FIGS. 3A and 3B show an example of a structure of a thin film circuit 102. In this case, the thin film circuit 102 is a driving circuit for a pixel of a display. FIG. 3A shows an example of a driving circuit for an organic electro luminescent element (OLED) as pixels in a display. The thin film circuit 102 comprises thin film transistors T1 and T2 and a capacitor C1. The thin film circuit 102 transferred into a pixel region Pmn is connected to a power source line Vcc, mth number's data line Idatam, nth number's scan line Vsn and a pixel electrode of a OLED.

FIG. 3B shows an example of an example of a driving circuit for a liquid crystal element (L) as pixels in a display. The thin film circuit 102 comprises thin film transistors T3 and a capacitor C2. The thin film circuit 102 transferred into a pixel region Pmn is connected to m th number's data line Ddatam, nth number's scan line Vsn and a pixel electrode of a L.

Figure 4:
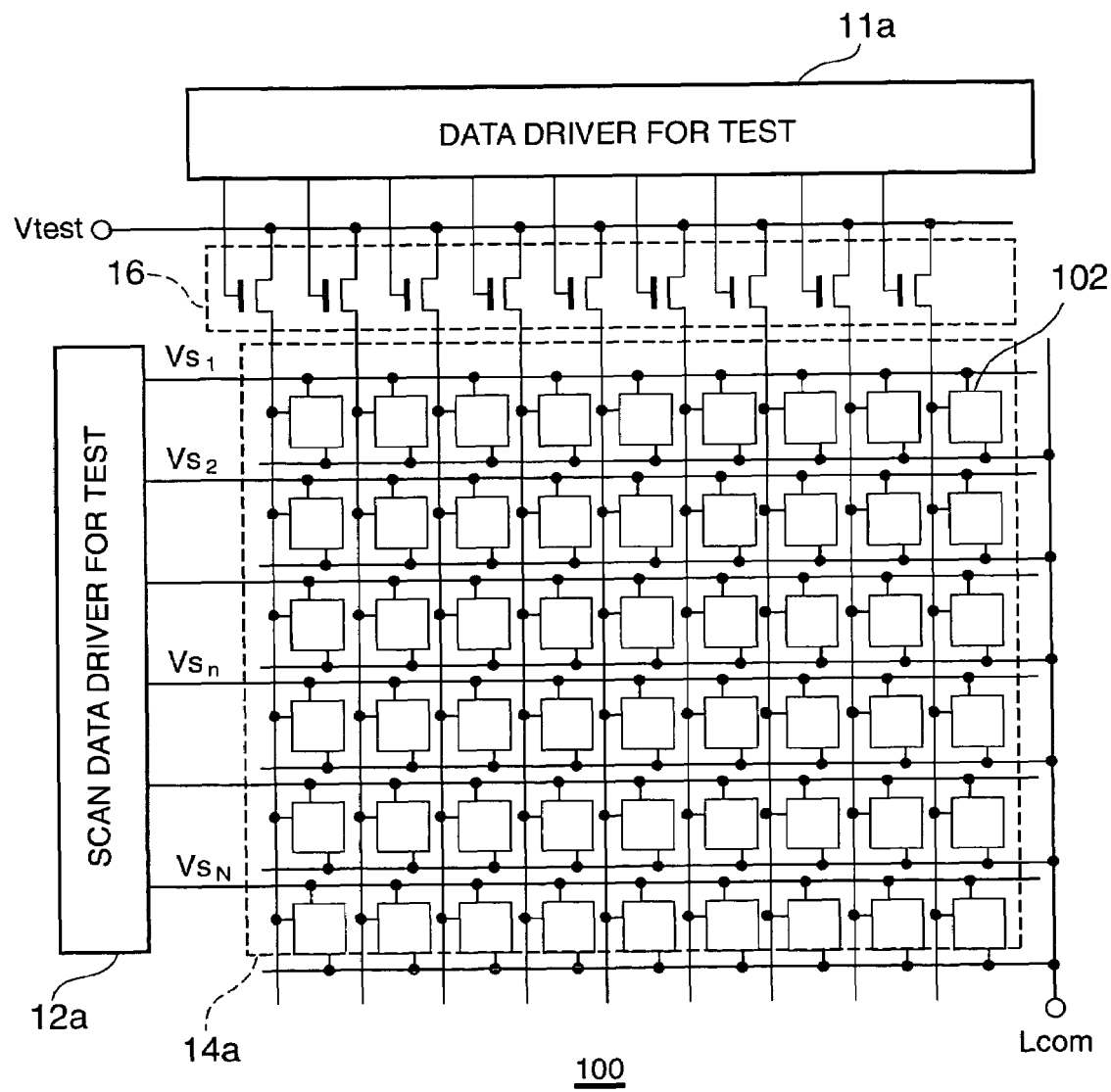
FIG. 4 shows an example of transfer thin film circuits, which are objects to be transferred, and test circuits formed on a transfer base substrate on the first embodiment.

FIG. 4 is a block diagram showing electrical connection between the test circuit and the thin film circuits on the transfer base substrate. The transfer base substrate 100 includes a data driver 11a for testing corresponding to the test circuit 11, a scan driver 12a for testing corresponding to the test circuit 12, an analog switch part 16 and an active matrix part 14a. The active matrix part 14a corresponds to the region 14 for forming thin film circuits, which has been already described. In this part, pixel circuits, which are thin film circuits 102 for transferring as shown in FIG. 3, are arranged in a matrix. Each of pixel circuits is connected to the common source line Lcom. Defect or non-defect of each of pixel circuits is judged by charging or discharging capacitance generated between the common source line Lcom and detective signal.

The computer system 10 for testing gives a command signal to the data driver 11a for testing and the scan driver 12a for testing, designating a thin film circuit, which is an object to be tested, with information of positioning arranged in a matrix. The command signal from the computer system 10 outputs a column selection signal from the data driver 11a for testing. The selection signal controls "on" or "off"of each of transistors in the analogue switch part 16, controlling connection of each of column lines with signal lines V test for testing. The signal lines V test for testing receives a predetermined current or voltage from the computer system 10. Further, the command signal from the computer system 10 makes the scan driver 12a for testing select each of scanning lines Vsn sequentially or individually. The data driver 11a for testing works in conjunction with the operation of the scan driver 12a for testing, selectively operating each of thin film circuits, which is an object to be transferred, and judging defect or non-defect of each of thin film circuits.

Figure 5:
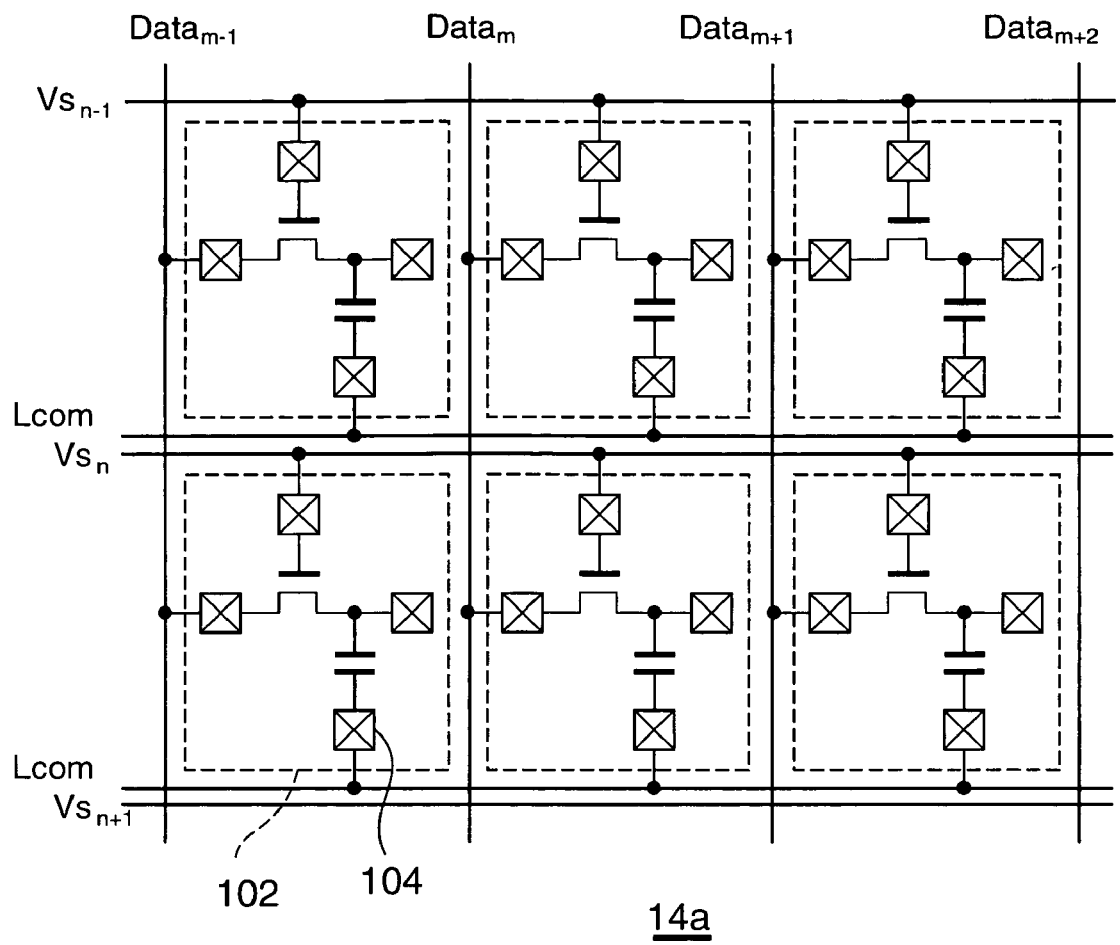
FIG. 5 shows a region for forming transfer thin film circuit in the first embodiment.

FIG. 5 is an enlarged view of the active matrix part 14a. Thin film circuits 102, which are objects to be transferred, are arranged in a matrix and includes connecting pads for connecting wirings in the substrate, which receives the transfer, after transferring. Each of thin film circuits 102, which are objects to be transferred, is electrically connected to other by the wiring arranged around the outer circumference of the thin film circuits 102 and in a manner of a grid shape. This arrangement can selectively check defect or non-defect of thin film circuits 102, which are objects to be transferred, with using the data driver 11a for testing works and the scan driver 12a for testing.

Figure 6:
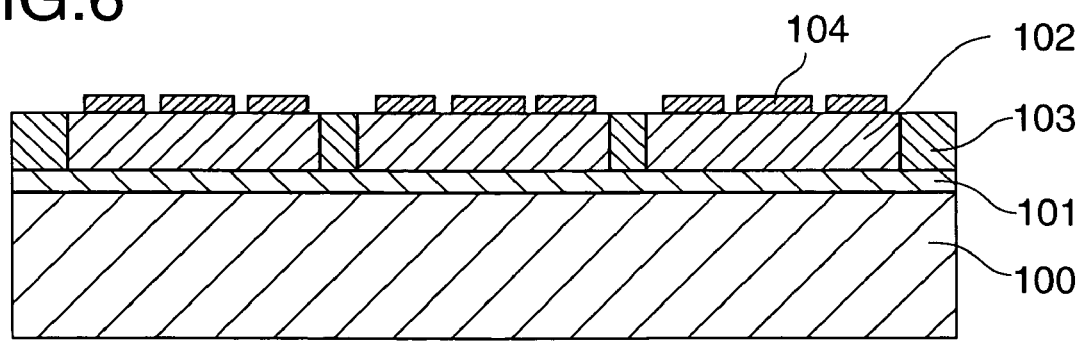
FIG. 6 shows a temporary transfer base substrate.

FIG. 6 is a cross section of a region of the active matrix part 14a of the transfer base substrate 100. The thin film circuits 102, which are objects to be transferred, and the wiring 103 are formed on the transfer base substrate 100 via a removing layer 101. As described above, pads 104 are formed for electrically connecting the substrate, which receives the transfer, on the thin film circuits 102. Further, the wiring 103 separate each of regions for thin film circuits 102 from others. As described above, only the thin film circuits 102, which are judged as non-defect by the above test method, are transferred to the substrate, which receives the transfer. Otherwise, only the thin film circuits 102, which are judged as non-defect, are transferred to a temporary substrate, and finally placed to the substrate, which receives the transfer.

Figure 7:
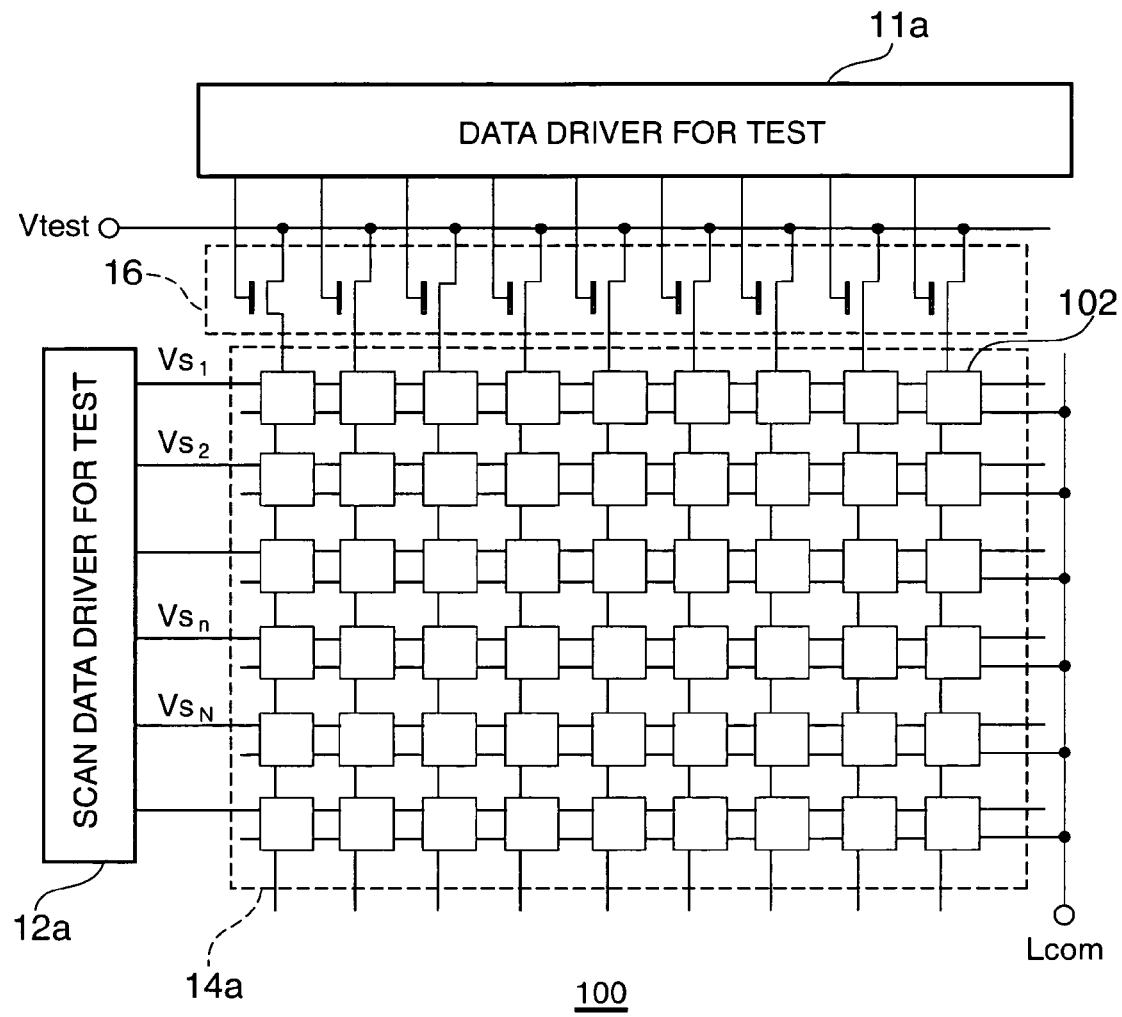
FIG. 7 shows a second embodiment of the present invention.

FIG.7 shows a second embodiment of the present invention. In the second embodiment, wirings within the thin film circuits 102 in the above active matrix part 14a is used as wirings for test. The structure of the thin film circuits 102 and overall configuration are the same of the first embodiment and these explanations are omitted with referring them as the same reference numerals.

Figure 8:
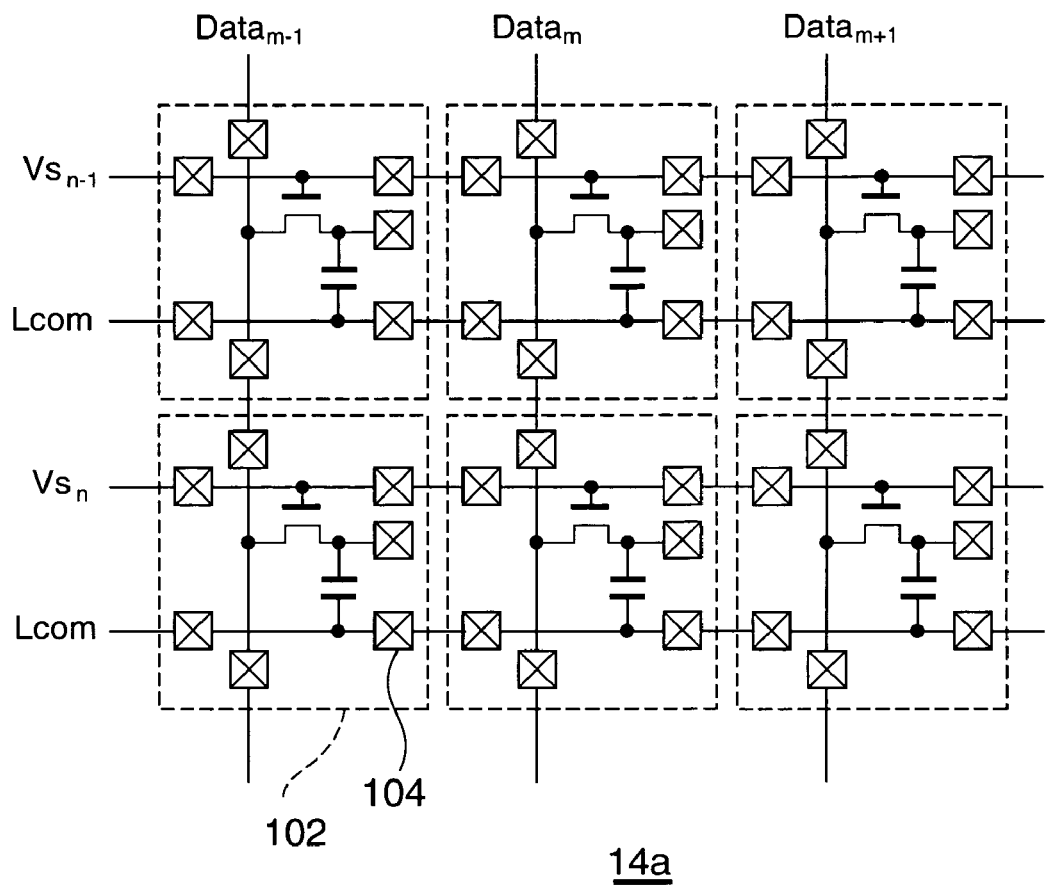
FIG. 8 shows a region for forming transfer thin film circuit in a second embodiment.

FIG. 8 is a enlarged view of the active matrix part 14a in the base transfer substrate 100 in the second embodiment. As shown in the figure, wirings Vsn, Data m for test go through an inner part of the thin film circuits 102. Many pads 104 are formed comparing with the first embodiment on each of the thin film circuits 102.

In the second embodiment, an area, which is assigned for a wiring connecting each of the thin film circuits 102, is small comparing with the first embodiment. Further, many areas can be assigned for the thin film circuits 102.

Figure 9:
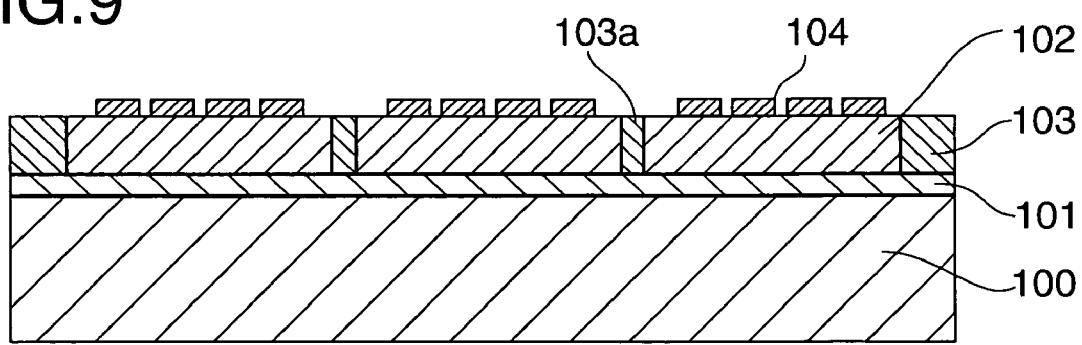
FIG. 9 shows a temporary transfer base substrate.
Figure 10:
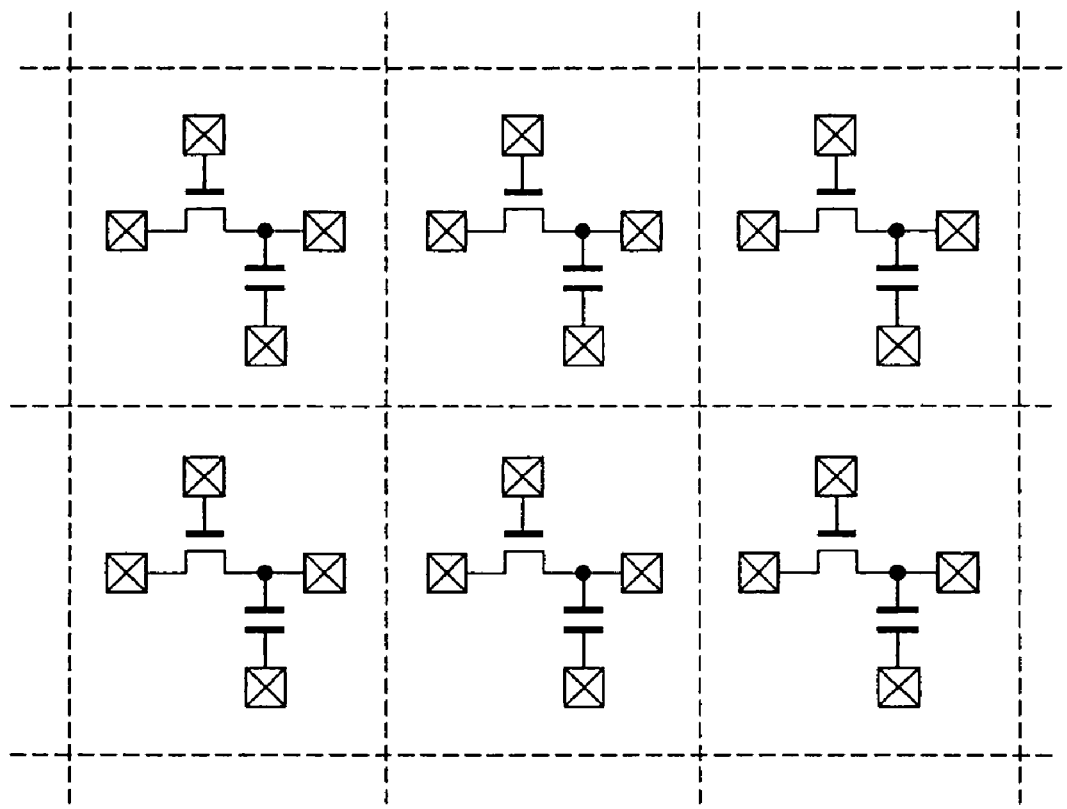
FIG. 10 shows an example of the conventional method of transferring transfer thin film circuits onto a transfer base substrate.

FIG. 9 is a cross sectional view of the active matrix part 14a in the base transfer substrate 100 in the second embodiment. As described above, the thin film circuits 102, which are objects to be transferred, and the wiring 103 are formed on the transfer base substrate 100 via a removing layer 101. Pads 104 are formed for electrically connecting the substrate, which receives the transfer, on the thin film circuits 102. Element isolation part 103a, which separates each of the thin film circuits 102 from other, has a narrow width comparing with the first embodiment, since wiring for test is not existed. Therefore, many areas can be assigned for the thin film circuits 102.

In the second embodiment, only the thin film circuits 102, which are judged as non-defect by the above test method, are transferred to the substrate, which receives the transfer. Otherwise, only the thin film circuits 102, which are judged as non-defect, are transferred to a temporary transfer substrate, and finally placed to the substrate, which receives the transfer.

Here, a test circuit is formed on the transfer base substrate in the above embodiment. But, a test circuit formed outside of the substrate may check each of thin film transfer circuits by installing terminals for coupling these thin film circuits with the outside test circuit.

Thus, according to the present embodiment, defect or non-defect of thin film circuits, which are objects to be transferred, is judged on the transfer base substrate and only non-defect thin film circuits are transferred directly or indirectly onto the substrate which receives the transfer thereafter. The method of the present invention can avoid defect of semiconductor devices with using a substrate, which receives the transfer, improving yield of manufacturing.

What is claimed is:

1. A method of manufacturing a semiconductor device, comprising:
    forming a plurality of transfer thin film circuits which are capable of being removed and transferred on a transfer base substrate;
    forming a test circuit that checks circuit operation of each of the plurality of transfer thin film circuits on the transfer base substrate;
    obtaining test data of each of the plurality of transfer thin film circuits after forming the plurality of transfer thin film circuits on the transfer base substrate by checking the circuit operation of each of the plurality of transfer thin film circuits via the test circuit; and
    at least one of the transfer thin film circuits transferring into a substrate after obtaining.

2. A method of checking a plurality of transfer thin film circuits which are formed on a transfer base substrate, the method comprising:
    checking a operation of each of the plurality of transfer thin film circuits by a test circuit that is formed on the transfer base substrate and that is coupled with the plurality of transfer thin film circuits.

3. The method of checking according to claim 2,
    the plurality of transfer thin film circuits being arranged in a matrix on the transfer base substrate;
    at least part of the test circuit being arranged along at least a part of an outer circumference of the matrix.

4. The method of checking according claim 3,
    the test circuit including a first driver that drives at least one of the plurality of transfer thin film circuits of at least one row in the matrix and a second driver that drives at least one of the plurality of transfer thin film circuits of at least one column in the matrix;
    checking at least one of the plurality of transfer thin film circuits at the intersection that is selected by at least one row by the first driver and one column by the second driver.

5. The method of checking according claim 2, the checking including;
    outputting a selecting signal from a first driver to one scanning line; and supplying a data signal to a group of transfer thin film circuits coupled to the one scanning line.

6. The method of checking according to claim 2, further comprising:

checking whether each of the plurality of transfer thin film circuits has defect or not.

7. A method of manufacturing a transfer base substrate, comprising:

forming a plurality of transfer thin film circuits which are capable of being removed and transferred on a substrate;

forming a test circuit for checking circuit operation of each of the plurality of transfer thin film circuits on a transfer base substrate; and forming a wiring separating one of the plurality of transfer thin film circuits from others so as to connect each of the plurality of transfer thin film circuits with a test circuit.

8. The method of manufacturing according to claim 5, the plurality of transfer thin film circuits are arranged in a matrix; and at least part of the test circuit being arranged along at least a part of a outer circumference of a region where the plurality of the transfer thin film circuits are formed.

9. The method of manufacturing according to claim 6, the test circuit including a first driver that drives at least one of the plurality of transfer thin film circuits of at least one row in the matrix and a second driver that drives at least one of the plurality of transfer thin film circuits of at least one column in the matrix.

10. The method of manufacturing according to claim 4, wherein forming the wiring is formed in at least a region of one of the transfer thin film circuits.

* * * * *